United States Patent
Sawamura et al.

(10) Patent No.: US 7,799,305 B2
(45) Date of Patent: Sep. 21, 2010

(54) SILICON CARBIDE SINGLE CRYSTAL AND SINGLE CRYSTAL WAFER

(75) Inventors: Mitsuru Sawamura, Futtsu (JP); Tatsuo Fujimoto, Futtsu (JP); Noboru Ohtani, Futtsu (JP); Masashi Nakabayashi, Futtsu (JP)

(73) Assignee: Nippon Steel Corporation, Tokyo (JP)

( * ) Notice: Subject to any disclaimer, the term of this patent is extended or adjusted under 35 U.S.C. 154(b) by 836 days.

(21) Appl. No.: 11/629,377

(22) PCT Filed: Jun. 15, 2005

(86) PCT No.: PCT/JP2005/011390

§ 371 (c)(1),
(2), (4) Date: Dec. 12, 2006

(87) PCT Pub. No.: WO2005/123992

PCT Pub. Date: Dec. 29, 2005

(65) Prior Publication Data

US 2008/0038531 A1   Feb. 14, 2008

(30) Foreign Application Priority Data

Jun. 17, 2004   (JP) ............................. 2004-179382

(51) Int. Cl.
   *C30B 29/36* (2006.01)
(52) U.S. Cl. ........................ 423/345; 423/439; 428/698; 252/516; 117/84
(58) Field of Classification Search .................. 252/516; 501/88; 423/345, 439; 117/13, 14
   See application file for complete search history.

(56) References Cited

U.S. PATENT DOCUMENTS 5,744,380 A   4/1998   Uemura et al.

2001/0023945 A1   9/2001   Carter, Jr. et al.

FOREIGN PATENT DOCUMENTS

JP   2003-500321 A   1/2003

(Continued)

OTHER PUBLICATIONS

Supplementary European Search Report dated Mar. 25, 2009 issued in corresponding European Application No. 75 2931.

(Continued)

*Primary Examiner*—Stanley Silverman
*Assistant Examiner*—Kallambella Vijayakumar
(74) *Attorney, Agent, or Firm*—Kenyon & Kenyon LLP

(57) ABSTRACT

The present invention provides a semi-insulating silicon carbide single crystal characterized by having an electrical resistivity at room temperature of $1\times10^5$ Ωcm or more, and a semi-insulating silicon carbide single crystal characterized by having an electrical resistivity at room temperature of $1\times10^5$ Ωcm or more and vacancy pairs (bivacancies), and an semi-insulating silicon carbide single crystal characterized by having an electrical resistivity at room temperature of $1\times10^5$ Ωcm or more and containing a crystal region where a position average lifetime becomes a lifetime longer than 155 ps in measurement of position lifetime at a liquid nitrogen boiling point temperature (77K) or less, and wafer obtained therefrom.

According to the present invention, by having vacancy clusters including vacancy pairs, the electrical conductivity can be reduced even when the nitrogen concentration is higher than the boron concentration and, in addition, a semi-insulating SiC single crystal resistant to change of the electrical conductivity even with heat treatment can be obtained.

11 Claims, 1 Drawing Sheet

FOREIGN PATENT DOCUMENTS

| WO | WO03/038868 | * | 5/2003 |
|---|---|---|---|
| WO | WO 03/038868 A2 | | 5/2003 |
| WO | WO 2004/027122 | | 4/2004 |

OTHER PUBLICATIONS

Puff et al. "An Investigation of Point Defects in Silicon Carbide" Applied Physics A: Materials Science & Processing, Springer International, DE, vol. 61, No. 1, Jul. 1, 1995, pp. 55-58, XP009015853, ISSN: 0947-8396.

W. Puff et al., Vacancy-Type Defects in Proton-Irradiated 6H- and 4H-SiC: A Systematic Study with Positron Annihilation Techniques; Materials Science Forum, 2000, vols. 338-342, pp. 969-972.

S. Dannefaer et al., Positron annihilation investigation of electron irradiation-produced defects in 6H-SiC, Diamond and Related Materials, 2004, vol. 13, pp. 157-165.

Yu. M. Tairov and V.F. Tsvetkov, "General Principles of Growing Large-Size Single Crystals of Various Silicon Carbide Polytypes" Journal of Crystal Growth, vol. 52, pp. 146-150 (1981).

W. J. Choyke, H. Matsunami, G. Pensl (Eds.), "Silicon Carbide Recent Major Advances", Springer, ISSN 1439-2674 (2003).

Ellison et al, "HTCVD Growth of semi-insulating 4H-SiC crystals with low defect density" Mat. Res. Soc. Symp., vol. 640, H1.2.1. (2001).

* cited by examiner

SILICON CARBIDE SINGLE CRYSTAL AND SINGLE CRYSTAL WAFER

TECHNICAL FIELD

The present invention relates to a semi-insulating silicon carbide single crystal and a silicon carbide single crystal wafer used mainly for various types of semiconductor electronic devices or their substrates.

BACKGROUND ART

Silicon carbide (SiC) has superior semiconductor characteristics and, compared with the conventional materials of silicon (Si), gallium arsenic (GaAs), etc., is particularly remarkably superior in heat resistance, insulation breakdown field, etc., so is being noted as a wafer material for power devices, high frequency devices, and various other types of semiconductor devices. As devices using SiC single crystal wafers, GaN-based blue light emitting diodes, Schottkey barrier diodes, etc. have already been commercialized. Further, in addition, this is being used for production of prototypes as a substrate material for GaN-based high frequency devices and low loss power devices such as MOSFETs.

At the present time, SiC single crystal ingots having a large size suitable for production of devices are generally being produced by sublimation recrystallization based on the improved Rayleigh method (Yu. M. Tairov and V. F. Tsvetkov, *Journal of Crystal Growth*, vol. 52 (1981) pp. 146). This sublimation recrystallization is based on 1) using an SiC single crystal wafer as a seed crystal and charging a graphite crucible with a material comprised of SiC crystal powder, 2) heating this in an argon or other inert gas atmosphere (13.3 Pa to 13.3 kPa) to a high temperature of about 2000 to 2400° C. or more, and 3) arranging the seed crystal and material powder so as to form a temperature gradient where the seed crystal becomes the lower temperature side compared with the material powder. Due to this, the sublimating gas produced from the material is diffused and transported in the seed crystal direction. Single crystal growth is realized by recrystallization on the seed crystal.

For device applications, control of the electrical conductivity characteristic of the wafer material in accordance with the application is necessary. For this purpose, it is necessary to establish technology keeping to a minimum the impurity concentration in the crystal so as to produce high purity single crystal as is the practice with production of Si, GaAs, and other conventional semiconductors. This is becoming important basic technology for enabling precision control of the electrical conductivity characteristic of single crystal wafers. In particular, the impurity element able to form a donor or acceptor has a great effect on the electrical conductivity characteristic of the single crystal. The dosage or mixed amount of the impurity has to be strictly managed.

In the case of a SiC single crystal, nitrogen and boron can be mentioned as typical elements corresponding to the above impurities. While depending on the polytype of the SiC single crystal, in the large forbidden band of SiC crystal extending up to 2.5 to 3.0 electron-volts (eV), nitrogen forms a donor level at the shallow position, while boron forms an acceptor level at the shallow position, so ionization is easy even at room temperature. The electrons or vacancies emitted from the nitrogen or boron atoms into the crystal become carriers and act to push up the electrical conductivity. Therefore, when, like in high frequency device applications, an extremely low electrical conductivity is required from the SiC single crystal wafer, the concentration of boron or nitrogen in the SiC crystal has to be reduced to at least $1 \times 10^{17}$ cm$^{-3}$ or less.

However, even if reducing the impurity concentration, carriers remain corresponding to the difference in the concentration of the impurity forming the acceptor level and the concentration of the impurity forming the donor level. Sufficiently low electrical conductivity cannot be reached by just these mechanisms. Therefore, to obtain a sufficiently low electrical conductivity, the introduction of impurities forming deep levels and atom vacancies etc. is being studied in semiconductor crystals. Various studies have been made on SiC crystals as well.

In particular, atom vacancies can form deep levels without relying on the addition of impurities, so this is considered a preferable method in terms of securing crystallinity and low electrical conductivity. However, the specific types of atom vacancies contributing to electrical conductivity had not been identified. Therefore, it had been necessary to identify and introduce the type of vacancies involved in electrical conductivity to secure a low electrical conductivity without relying on the addition of impurities.

To realize a sufficiently low electrical conductivity, that is, semi-insulation, it is considered necessary to satisfy $|n_D - n_A| < n_V$ from the relationship between the vacancy and carrier concentrations. Here, $n_D$, $n_A$, and $n_V$ are the donor concentration, acceptor concentration, and vacancy concentration involved with the electrical conductivity. To satisfy this equation, both the donor concentration and acceptor concentration have to be reduced. Reduction of the nitrogen impurity concentration contributing to the donor concentration and the boron and aluminum impurity concentrations contributing to the acceptor concentration is being sought. However, in practice, the nitrogen impurity and boron impurity easily enter from the SiC material, graphite crucible, etc., so reduction of the impurity concentration is difficult. In particular, nitrogen is also included in the atmosphere, so more easily enters. In the impurity concentration in SiC single crystal, the nitrogen impurity concentration is often higher than the boron impurity concentration and as a result $n_D - n_A < n_V$ must be satisfied. This situation means that the type of the vacancies also has an effect.

That is, since the donor concentration is high, among the various types of vacancies, the condition is added that the charged state of the vacancies be negative, that is, that electrons can be accepted. In addition, as a condition sought for the type of the vacancies, in particular thermal stability is important. The reason is in part that depending on the type, the vacancies are greatly decreased by heat treatment. Heat treatment is necessary in the process of forming the various types of films required for formation of the devices on an SiC single crystal wafer. For this reason, in preventing change of the electrical conductivity of the wafer due to heat treatment, it has also been strongly desired that the vacancies be of a type difficult to decrease due to heat treatment. In addition, since it is known that depending on the type, vacancies are greatly decreased by heat treatment, thermal stability has been important as a condition required in the type of vacancies.

DISCLOSURE OF THE INVENTION

As explained above, the following two conditions may be mentioned as conditions sought for the type of vacancies contributing to reduction of the electrical conductivity. One is that the nitrogen impurity concentration is often higher than the boron impurity concentration, so the charged state of the vacancies should be negative. The other is that to prevent a change in the electrical conductivity of a wafer due to heat treatment, the vacancies should be of a type resistant to decrease by heat treatment. The reason is that at the time of heat treatment in the process of forming the various types of film required for forming devices on an SiC single crystal wafer, it is necessary to prevent change of the electrical conductivity of the wafer due to heat treatment. It has been considered necessary to identify and introduce a type of vacancies satisfying all of these conditions.

The present invention was made in consideration of the above situation and provides a semi-insulating SiC single crystal and semi-insulating SiC single crystal wafer resistant to change of the electrical conductivity even with heat treatment due to the presence of a specific type of vacancies. Its gist is as follows.

(1) A semi-insulating silicon carbide single crystal characterized by having an electrical resistivity at room temperature of $1\times10^5$ Ωcm or more and vacancy clusters of pluralities of atom vacancies clustered together.

(2) A semi-insulating silicon carbide single crystal characterized by having an electrical resistivity at room temperature of $1\times10^5$ Ωcm or more and vacancy pairs (bivacancies).

(3) A semi-insulating silicon carbide single crystal characterized by having an electrical resistivity at room temperature of $1\times10^5$ Ωcm or more and containing a crystal region where a positron average lifetime becomes a lifetime longer than 155 ps in measurement of positron lifetime at a liquid nitrogen boiling point temperature (77K) or less.

(4) A semi-insulating silicon carbide single crystal as set forth in any one of (1) to (3) having a region where a nitrogen concentration of the silicon carbide single crystal exceeds a boron concentration.

(5) A semi-insulating silicon carbide single crystal as set forth in (4) having a region where a nitrogen concentration of the silicon carbide single crystal is $1\times10^{17}$ cm$^{-3}$ or less.

(6) A semi-insulating silicon carbide single crystal as set forth in (4) or (5) having a region where a boron concentration of the silicon carbide single crystal is $5\times10^{16}$ cm$^{-3}$ or less.

(7) A semi-insulating silicon carbide single crystal as set forth in any one of (4) to (6) having a region where a difference of the nitrogen concentration and boron concentration of the silicon carbide single crystal is $3\times10^{16}$ cm$^{-3}$ or less.

(8) A semi-insulating silicon carbide single crystal as set forth in any one of (1) to (7) wherein a polytype of the silicon carbide single crystal is 4H or 6H.

(9) A semi-insulating silicon carbide single crystal wafer comprised of a semi-insulating silicon carbide single crystal as set forth in any one of (1) to (8) which is worked and polished.

(10) A semi-insulating silicon carbide single crystal wafer as set forth in (9) wherein the single crystal wafer has a size of 50 mm or more.

BEST MODE FOR WORKING THE INVENTION

Figure 1:
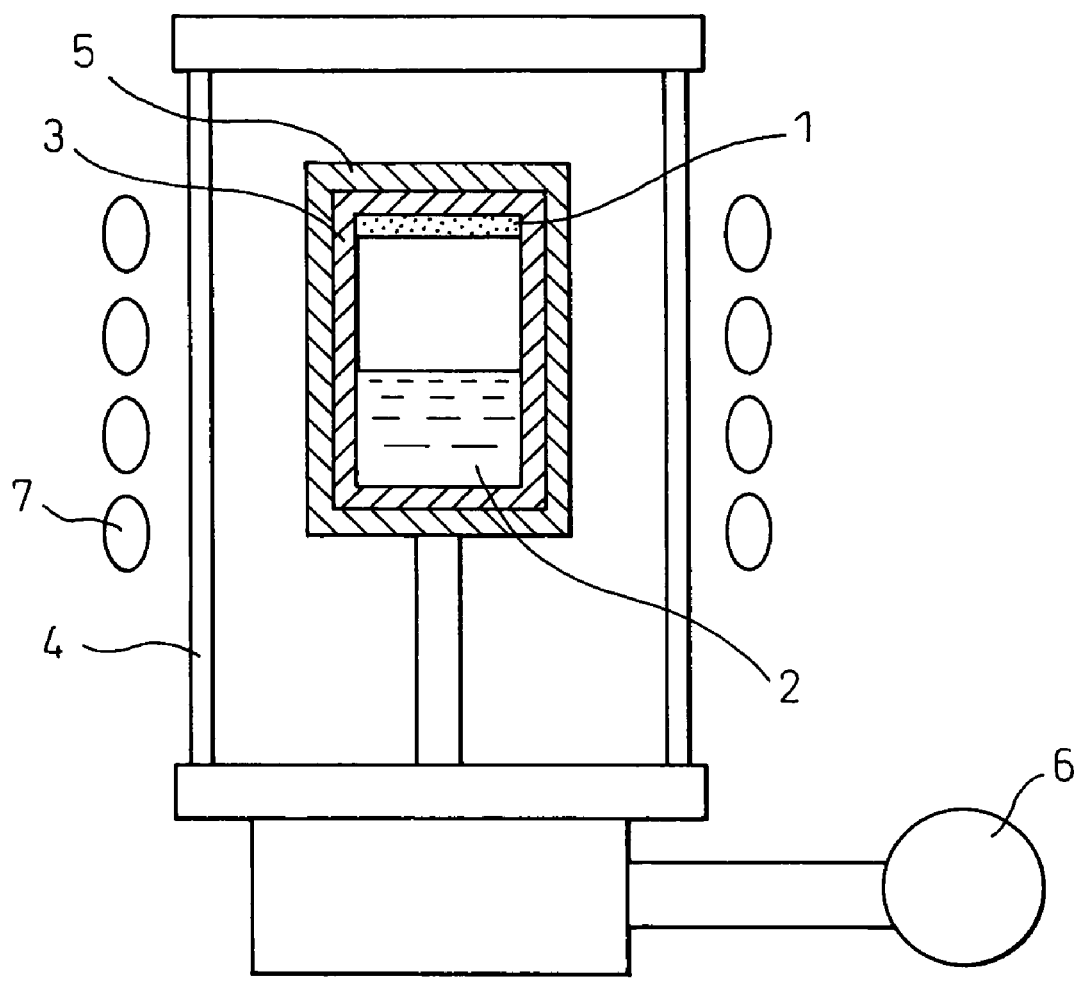
FIG. 1 is a view of the configuration showing an example of a single crystal growth system used in the present invention.

In view of the above situation, the inventors searched for a semi-insulating SiC single crystal resistant to change of the electrical conductivity even with the heat treatment in sublimation recrystallization. During this, they particularly focused on vacancy pairs etc. and investigated in detail vacancy pairs and electrical conductivity. As a result, they newly discovered that the presence of bivacancies is important for reduction of the electrical conductivity. Here, "semi-insulating" indicates $1\times10^5$ Ωcm or more at room temperature, preferably $1\times10^8$ Ωcm or more, more desirably $1\times10^{12}$ Ωcm or more. As the upper limit value, $1\times10^{40}$ Ωcm may be mentioned. Further, "room temperature" usually indicates 20° C.

For reduction of the electrical conductivity, in general formation of a deep level able to compensate for the donor or acceptor is effective. As candidates, atom vacancies and other vacancy defects have been studied. In the case of an SiC single crystal, Si vacancies, C vacancies, etc. may be mentioned. As the method for detection of these, ESR (electron spin resonance) and positron annihilation may be mentioned. Among these, with positron annihilation, mainly positrons are trapped in the vacancy parts. This shows the annihilation time reflecting the type of vacancies (positron annihilation lifetime) and enables identification of the type of vacancies etc.

According to the publications, the positron annihilation lifetime of SiC bulk itself is considered to be 136 to 146 ps, that of C vacancies 142 to 155 ps, and Si vacancies 185 to 194 ps. With further larger vacancy clusters, for example, it is reported that the lifetime of vacancy pairs (VsiVc) etc. is about 210 to 230 ps or a longer annihilation lifetime (*Silicon Carbide*, W. J. Choyke, H. Matsunami, G. Pensl (Eds.), Springer, ISSN 1439-2674 (2003)). Further, as other types of vacancies, tetravacancy (2VsiVc), hexavacancy (3VsiVc), octovacancy (4VsiVc), etc. may be mentioned. Their positron annihilation lifetimes are further longer lifetime and may be considered to be 250 to 260 ps, 280 to 290 ps, and 320 to 330 ps.

The positron annihilation lifetime is obtained based on the observed positron lifetime spectrum. The average lifetime found from this spectrum as a whole is the average value including the SiC bulk positron lifetime. Normally, in the case of an SiC single crystal prepared by the improved Rayleigh method, generally the strength of the SiC bulk is high. In this way, the average lifetime is lengthened by the type of vacancies, but is the average value with the bulk with the short lifetime. The obtained average lifetime tends to become shorter than the positron lifetime of the type of vacancies.

The inventors, in particular, measured SiC single crystal with a low electrical conductivity by positron annihilation, whereupon they confirmed for the first time that an SiC single crystal with a low electrical conductivity has a long lifetime different from Si vacancies and C vacancies. Further, they learned that in an SiC single crystal with a relatively high electrical conductivity, this is not observed in the range of a high donor concentration and concluded that this is inherent to an Si C single crystal with a low electrical conductivity. Judging from the results of the average lifetime exceeding 155 ps, this shows not simple atom vacancies having short lifetimes like C vacancies, but the presence of Si vacancies or vacancy pairs or other vacancies clustered together to form vacancy clusters (including vacancy pairs). Further, the inventors measured the impurity element concentration in the crystal for samples measured for positron annihilation by secondary ion mass spectroscopy (SIMS), whereupon samples with a low electrical conductivity all exhibited a nitrogen concentration higher than the boron concentration. For reduction of the electrical conductivity, the presence of vacancies in the negative charged state is necessary. For this reason, at the present time, it is learned that C vacancies where only the positive charged state has been discovered from the results of observation do not directly contribute to the reduction of the electrical conductivity.

On the other hand, Si vacancies are considered to be annihilated by heat treatment of 1600° C. or more (*Mat. Res. Soc. Symp.*, vol. 640, H1.2.1). The inventors heat treated SiC single crystal with a low electrical conductivity at 1600° C. for 30 minutes or more, whereupon they confirmed that the electrical conductivity did not change much at all. Judging from the results, the reduction of the electrical conductivity can be said to be due less to the contribution of the Si vacancies and more to the contribution of the vacancy pairs considered thermally stable. Based on this detailed study, the presence of vacancy clusters including vacancy pairs forms deep levels and compensates for the excess donor or acceptor supplying the carriers—leading to the conclusion that a single crystal with a low electrical conductivity is formed. That is, the presence of vacancy clusters including vacancy pairs reduces the electrical conductivity and in addition gives a semi-insulating SiC single crystal resistant to changes in electrical conductivity even with heat treatment.

In this way, for reduction of the electrical conductivity, the presence of vacancy pairs or vacancy clusters is important. These observations mean that positron annihilation is effective. Regarding the measurement temperature of the SiC single crystal sample by this positron annihilation, from the viewpoint of measurement in an environment with little temperature disturbances as well, the measurement is performed at a low temperature near the liquid nitrogen boiling point temperature (77K) or less, but the lower limit value is made the temperature of the boiling point of liquid helium (4.2K) which can be relatively easily industrially reached. Further, atom vacancies such as Si vacancies and C vacancies can also be present simultaneously with the vacancy clusters. Presence is usual.

When there is a sufficient amount of vacancy clusters, by measurement of the lifetime by positron annihilation, the average lifetime itself is 155 ps or more. However, the average lifetime by the positron annihilation also changes depending on the presence of atom vacancies such as Si vacancies and C vacancies and sometimes even falls below 155 ps. In this case as well, regarding the presence of vacancy clusters, fitting analysis is performed not by the average lifetime, but by two or more lifetime ingredients from the measurement data (equation (23.2) described in *Silicon Carbide*, W. J. Choyke, H. Matsunami. G. Pensl (eds.), Springer, ISSN 1439-2674 (2003), pp. 574). Based on the point that lifetime ingredients can be separated, if even one of the lifetime ingredients exceeds 185 to 194 ps, considered the lifetime of Si vacancies, this can be considered to show the presence of vacancy clusters, including vacancy pairs.

Further, a "vacancy cluster" is a cluster of a plurality of atom vacancies. Among these, as one candidate able to contribute to the reduction of the electrical conductivity, vacancy pairs (atom vacancy pairs VsiVc) may be mentioned. Further, the vacancy cluster concentration or vacancy pair concentration necessary for reduction of the electrical conductivity is at least $1\times10^{15}$ cm$^{-3}$ or more, desirably $1\times10^{16}$ cm$^{-3}$ or more. In addition, the "vacancy cluster concentration" here is the concentration including the vacancy pair concentration. Further, as methods for positively introducing such vacancy clusters or vacancy pairs, raising the crystal growth temperature, increasing the rate of crystal growth, or other means may be mentioned.

Further, to sufficiently reduce the electrical conductivity, in addition to the presence of the vacancy clusters, it is important to reduce the donor or acceptor forming the carrier. It is effective to reduce the amount of mixture of the causative impurity elements. Typical impurity elements forming the carriers forming the donor include nitrogen etc. Similarly, as typical impurity elements forming the acceptor, boron etc. may be mentioned. To realize sufficient reduction of the electrical conductivity, preferably the impurity nitrogen concentration is $1\times10^{17}$ cm$^{-3}$ or less and the boron concentration is $5\times10^{16}$ cm$^{-3}$ or less, more preferably the difference of the nitrogen concentration and boron concentration is $3\times10^{16}$ cm$^{-3}$ or less. Most preferably, the nitrogen concentration is higher than the boron concentration. In this case, this leads more effectively to a reduction in the electrical conductivity. Further, as an impurity element, it is considered that the element vanadium forms a deep level trapping the carriers. This leads to a further reduction of the electrical conductivity, so the element vanadium can also be added to and mixed into the SiC single crystal.

SiC single crystal with vacancy clusters is effective for both the 4H or 6H polytype viewed as promising for device applications at present. Further, due to the increased size of crystals, in particular, crystals of a size of 50 mm or more, stable semi-insulation resistant to change in the electrical conductivity even with the heat treatment performed in the device forming process is obtained even for single crystal wafers produced by working using a wire saw, diamond abrasives, etc. and a polishing process. As a result, it is possible to raise the yield of various types of devices prepared on this SiC single crystal and possible to greatly reduce the production costs. Note that no particular upper limit is set on the size, but 300 mm or less is made the guideline.

EXAMPLES

Below, examples of the present invention will be explained.

The usual sublimation recrystallization using a seed crystal was used to prepare a single crystal of a diameter of 50 mm and a polytype of 4H (ingot I, ingot II). FIG. 1 shows a schematic view of a growth furnace and crucible used. In the vacuum chamber provided with a vacuum evacuation system 6, a graphite crucible 3 is provided. This graphite crucible 3 was filled with the SiC material 2, then a single crystal seed crystal substrate 1 of a polytype of 4H was attached to a surface facing the top. A heat insulating material 5 was used to protect the graphite crucible 3 which was then heated by a high frequency coil 7 to cause the material powder to sublimate and grow a crystal on the seed crystal substrate. As the atmospheric gas, they used argon gas with a purity of 99.9999% or more. Further, the inventors measured the nitrogen concentration and boron concentrations included in the SiC material by secondary ion mass spectrometry (SIMS), whereupon they were $8\times10^{15}$ cm$^{-3}$ and $1.5\times10^{16}$ cm$^{-3}$.

The ingot I was obtained by adjusting the pressure in the oven to $4\times10^2$ Pa and raising the temperature to a high temperature of about 2000° C. or more for crystal growth. The rate of crystal growth at this time was about 0.9 mm/hour. The thus obtained single crystal was sliced in parallel in the plane vertical to the growth direction and a wafer of a thickness of about 0.6 mm (wafer I) was cut out from a position 11 mm from the seed crystal.

Further, the ingot II prepared for comparison was obtained by adjusting the pressure in the oven to $2.7\times10^3$ Pa and raising the temperature to a high temperature of about 2000° C. or more for crystal growth. The rate of crystal growth at this time was about 0.3 mm/hour. The thus obtained single crystal was sliced in parallel in the plane vertical to the growth direction and a wafer of a thickness of about 0.6 mm (wafer II) was cut out from a position 12 mm from the seed crystal.

Further, the inventors cut out a square sample of 12 mm square from the approximate center of each wafer, measured the positron annihilation in the state cooled to 77K, and evaluated the positron lifetime. After this, they used the same samples to measure the electrical resistivity at room temperature. Table 1 shows the results of measurement of the positron average lifetime and electrical resistivity of samples of the wafer I and the wafer II.

TABLE 1

|  | Positron average lifetime (ps) | Electrical resistivity (Ωcm) |
|---|---|---|
| Wafer I | 168 | $8.7 \times 10^9$ |
| Wafer II | 149 | $3.1 \times 10^4$ |

In this example, the sample cut out from the wafer I had a lifetime of over 155 ps. Further, the inventors performed fitting analysis by two lifetime ingredients from the positron annihilation lifetime measurement data whereupon the two lifetimes were 142 ps and 222 ps. From this viewpoint, it could be judged that the sample was a SiC single crystal sample including vacancy clusters of the present invention, in particular a SiC single crystal sample including vacancy pairs since the 222 ps lifetime ingredient was separated and this value is close to the positron lifetime of the vacancy pairs. Further, it could be confirmed that this sample also had an electrical resistivity of $1\times10^5$ Ωcm or more. Conversely, with the sample cut out from the wafer II, the average lifetime was 155 ps or less. It was judged that they did not have sufficient vacancy clusters, but the inventors learned that the electrical resistivity was also less than $1\times10^5$ Ωcm.

The inventors measured the nitrogen and boron concentrations in the crystal by secondary ion mass spectrometer (SIMS) for a sample cut out from the wafer I, whereupon they learned that the nitrogen and boron concentrations were $2.5\times10^{16}$ cm$^{-3}$ and $1.2\times10^{16}$ cm$^{-3}$, when the nitrogen concentration was $1\times10^{17}$ cm$^{-3}$ or less, the boron concentration was also $5\times10^{16}$ cm$^{-3}$ or less, and when the difference of the nitrogen concentration and boron concentration was $3\times10^{16}$ cm$^{-3}$ or less, the nitrogen concentration was higher than the boron concentration. Note that for caution's sake, the inventors measured the concentration of aluminum able to form an acceptor and found it was $6\times10^{14}$ cm$^{-3}$.

Further, the inventors measured the electrical resistivity after heat treatment of a sample cut out from the wafer I at a vacuum degree of $1.3\times10^{-3}$ Pa at 1650° C. for 30 minutes, whereupon they found it was $7.9\times10^9$ Ωcm at room temperature, that is, there was almost no change at all.

In this way, as explained in the present invention, it is clear that in an SiC single crystal sample where the presence of vacancy clusters is observed, a semi-insulating property resistant to change of electrical conductivity even with heat treatment is exhibited.

INDUSTRIAL APPLICABILITY

According to the present invention, by having vacancy clusters including vacancy pairs, the electrical conductivity can be reduced even when the nitrogen concentration is higher than the boron concentration and, in addition, a semi-insulating SiC single crystal resistant to change of the electrical conductivity even with heat treatment can be obtained. If working this SiC single crystal for use as a polished SiC single crystal wafer, it is possible to fabricate high withstand voltage, environment-resistant electronic devices superior in electrical characteristics with a good yield.

The invention claimed is:

1. A semi-insulating silicon carbide single crystal characterized by having an electrical resistivity at room temperature of $1\times10^5$ Ωcm or more and a vacancy cluster concentration of $1\times10^{15}$ cm$^{-3}$ or more, wherein a vacancy cluster is a plurality of atom vacancies clustered together.

2. A semi-insulating silicon carbide single crystal characterized by having an electrical resistivity at room temperature of $1\times10^5$ Ωcm or more and a vacancy pair (bivacancy) concentration of $1\times10^{15}$ cm$^{-3}$ or more.

3. A semi-insulating silicon carbide single crystal as set forth in claim 1 or 2, containing a crystal region where a positron average lifetime is longer than 155 ps measured at a liquid nitrogen boiling point temperature (77K) or less.

4. A semi-insulating silicon carbide single crystal as set forth in claim 1 or 2 having a region where a nitrogen concentration of said silicon carbide single crystal exceeds a boron concentration.

5. A semi-insulating silicon carbide single crystal as set forth in claim 4 having a region where a nitrogen concentration of said silicon carbide single crystal is $1\times10^{17}$ cm$^{-3}$ or less.

6. A semi-insulating silicon carbide single crystal as set forth in claim 4 having a region where a boron concentration of said silicon carbide single crystal is $5\times10^{16}$ cm$^{-3}$ or less.

7. A semi-insulating silicon carbide single crystal as set forth in claim 4 having a region where a difference of the nitrogen concentration and boron concentration of said silicon carbide single crystal is $3\times10^{16}$ cm$^{-3}$ or less.

8. A semi-insulating silicon carbide single crystal as set forth in claim 1 or 2 wherein a polytype of said silicon carbide single crystal is 4H.

9. A semi-insulating silicon carbide single crystal wafer comprised of a semi-insulating silicon carbide single crystal as set forth in claim 1 or 2 which is worked and polished.

10. A semi-insulating silicon carbide single crystal wafer as set forth in claim 9, wherein said single crystal wafer has a diameter of 50 mm or more.

11. A semi-insulating silicon carbide single crystal as set forth in claim 1 or 2 wherein a polytype of said silicon carbide single crystal is 6H.

* * * * *